United States Patent
Manaud et al.

(10) Patent No.: US 8,962,100 B2
(45) Date of Patent: Feb. 24, 2015

(54) METHOD FOR MAKING DIAMOND COMPOSITE MATERIALS

(75) Inventors: Jean-Pierre Manaud, Saint-Loubes (FR); Angéline Poulon, Arsac (FR); Lionel Teule-Gay, Bordeaux (FR); Cyril Faure, Bourdeilles (FR)

(73) Assignee: Centre National de la Recherche Scientifique, Paris (FR)

( * ) Notice: Subject to any disclaimer, the term of this patent is extended or adjusted under 35 U.S.C. 154(b) by 706 days.

(21) Appl. No.: 13/140,649

(22) PCT Filed: Dec. 17, 2009

(86) PCT No.: PCT/FR2009/001440
§ 371 (c)(1),
(2), (4) Date: Jul. 11, 2011

(87) PCT Pub. No.: WO2010/076423
PCT Pub. Date: Jul. 8, 2010

(65) Prior Publication Data
US 2011/0256347 A1    Oct. 20, 2011

(30) Foreign Application Priority Data

Dec. 19, 2008   (FR) .................................... 08 07181

(51) Int. Cl.
*H05H 1/24*    (2006.01)
*C23C 16/02*   (2006.01)
*C23C 16/27*   (2006.01)

(52) U.S. Cl.
CPC .......... *C23C 16/0272* (2013.01); *C23C 16/271* (2013.01)

USPC .......................................................... 427/577

(58) Field of Classification Search
CPC ...... C23C 16/26; C23C 16/274; C23C 16/27; C23C 16/272; C23C 16/277
USPC .......................................................... 427/577
See application file for complete search history.

(56) References Cited

U.S. PATENT DOCUMENTS

2003/0039520 A1\* 2/2003 Okamura et al. ............. 407/118

FOREIGN PATENT DOCUMENTS

| CN | 1 827 846 A | 9/2006 |
| EP | 0 445 305 A1 | 9/1991 |
| JP | 5-270982 A | 10/1993 |
| JP | 05270982 A * | 10/1993 |

OTHER PUBLICATIONS

Yugo et al. Generation of diamond nuclei by electric field in plasma chemical vapor deposition, App Phys Lett, 58, 1991, pp. 1036-1038.*
Manaud et al. A comparative study of CrN, ZrN, NbN and TaN layers as cobalt diffusion barriers for CVD diamond deposition on WC—Co tools, Surf & Coat Tech, 202, 2007, pp. 222-231.*

(Continued)

*Primary Examiner* — Kelly M Gambetta
(74) *Attorney, Agent, or Firm* — Alston & Bird LLP

(57) ABSTRACT

The invention relates to a method for depositing a diamond coating onto a substrate, said method resulting in the production of a coating characterized by a novel morphology of the diamond in the form of pyramids containing submicronic grains. The method is carried out by chemical vapor deposition by controlling the applied electric field.

12 Claims, 4 Drawing Sheets

(56) References Cited

OTHER PUBLICATIONS

Zhang, W. J. et al., Structuring nanodiamond cone arrays for improved field emission, Appl. Phys. Lett. 83, 3365, 2003.*
Opinion for International Application No. PCT/FR2009/001440 (undated).
Manaud, J. P. et al., *A Comparative Study of CrN, ZrN, NbN and TaN Layers as Cobalt Diffusion Barriers for CVD Diamond Deposition on WC—Co Tools*, Surface & Coatings Technology 202 (2007), pp. 222-231.
Almeida, F. a. et al., Vacuum, 81:1443-1447 (2007).
Askari, S. J. et al., Vacuum 81:713-717 (2007).
Askari et al., Diamond & Related Materials, 17:294-299 (2008).
Cicala, G. et al., Diamond & Related Materials 14:421-425 (2005).
Huang, Y. et al., Thin Solid Films, vol. 472, Issues 1-2, pp. 20-25, (2005).
Joffreau, P-O et al., MRS Spring Films, Reno, Navada, Apr. 5-9, 1988.
Li, H. et al., Diamond & Related Materials, 16:1918-1923 (2007).
Matsumoto, S. et al., J. of Materials Science, 17:3106-12 (1982).
Sein, H. et al., Diamond & Related Materials, 13:610-615 (2004).
Spitsyn, B. V. et al., J. of Crystal Growth, 52:219-26 (1981).

* cited by examiner

METHOD FOR MAKING DIAMOND COMPOSITE MATERIALS

FIELD OF THE INVENTION

One subject of the present invention is a process for depositing a diamond coating on a support, this process leading to a coating being obtained that is characterized by a novel morphology of the diamond in the form of pyramids made up of submicron grains. Another subject of the invention is the coatings and articles obtained by this process.

BACKGROUND

Composites comprising a support or substrate onto which a layer of diamond or of diamond-like carbon is deposited have been known for a long time.

Such composites are customarily obtained by chemical vapor deposition (CVD) of carbon atoms onto the substrate. The methods for carrying out the CVD process for obtaining diamond coatings are described in B. V. Spitsyn et al., J. of Crystal Growth 52 (1981), 219-26 and S. Matsumoto et al., J. of Materials Science 17 (1982), 3106-12. The document by J.-P. Manaud et al., Surface & Coatings Technology 202 (2007), 222-231 describes the formation of diamond seeds obtained without polarization of the substrate which resulted in the formation of cubo-octahedral microcrystals. The size of these crystals varies from a few microns to a few tens of microns. However, these composites are not without drawbacks: the diamond is composed of covalent tetrahedral carbon with very strong $sp^3$ hydridized bonding. Therefore, the nuclei have little aptitude for creating bonds of a chemical nature with the substrates. The internal tensions of the coating, the poor adhesion of the coating to the substrate and the difference in the thermomechanical properties between the coating and the substrate result in high brittleness of these composites.

However, these composites are designed to be used in very sensitive sectors such as the manufacture of tools for machining composites intended for the aeronautics industry, and these composites are highly abrasive and destructive for the cutting tool. They may also be used as implants in the biomedical field, or else they may be used as tools in odontology. Their use has also been proposed in the field of chemical engineering as mechanical seals for pumping corrosive liquids due to the high chemical inertness of the diamond.

In all these applications, a high reliability of the diamond materials is expected, but the processes currently known do not make it possible to obtain the desired result.

In particular, as regards the manufacture of tools for machining composites, these are extremely abrasive so that the cutting edges of the tools are eroded and rounded off from the first contact with the material. Local heating ensues, which accelerates the destruction of the tool and damages the machined surface (local melting, delamination, etc.). The protection of the surface of the cutting tools is therefore essential. Diamond is a material of choice since it is reputed to be the hardest present in nature. In recent years, tools treated with MCD (microcrystalline diamond) and more recently NCD (nanocrystalline diamond) have appeared. The first treatment was very rapidly characterized by its lack of reliability. The second, more performing, did not achieve however the properties of PCD (polycrystalline diamond: coated diamond crystals) tools. Unfortunately, the manufacture of the latter, for certain types of tools such as drills or small-diameter cutters remains to date nonexistent because of being technically difficult and economically very costly.

And in particular, in the case of tools based on cobalt tungsten carbide (WC—Co), which are used for machining parts made of highly abrasive materials such as nonferrous metal alloys, composites and ceramics, the presence of cobalt in the substrate (generally between 6 and 10%) has a negative influence on the diamond deposition process. The presence of Co promotes the formation of non-diamond carbon-based phases, that is to say for the most of graphite, which leads to a weak adhesion of the diamond-like coating to the substrate.

To solve this problem, various methods have been proposed, for improving the quality of the diamond coating and its adhesion to the substrate: chemical pickling, which depletes the substrate of cobalt at its surface, and the deposition of a diffusion barrier. However, none of these methods is sufficient to completely solve the problem.

The reaction scheme for the deposition of a diamond-like coating comprises three steps: initiation, nucleation and growth.

In the processes customarily used, in the nucleation step, the supersaturation in carbon (G. Cicala et al., Diamond & Related Materials 14 (2005), 421-425; S. J. Askari et al., Vacuum 81 (2007), 713-717; S. J. Askari et al., Diamond & Related Materials 17 (2008), 294-299) in the absence of an electric field results in an increase in the presence of graphite ($sp^2$) species and therefore a reduction in the adhesion of diamond ($sp^3$) nuclei (F. A. Almeida et al., Vacuum 81 (2007), 1443-1447).

Certain authors (H. Sein et al., Diamond & Related Materials 13 (2004), 610-615; H. Li et al., Diamond & Related Materials 16 (2007), 1918-1923) have proposed using a supersaturation in carbon together with an electric field in the nucleation step, so as to obtain a very high nucleation density, an increase in the adhesion of the seeds and therefore a better adhesion of the coating. But these properties must be improved further in order to satisfy the requirements linked to applications in materials having a diamond coating.

Documents CN 1827846 and JP 19920071435 describe a process for growing diamond films. This process comprises a nucleation step, under an electric field of negative voltage and a deposition or growth step under an electric field of positive voltage. This process results in the formation of micro-diamond grains, the morphology and texturing of which are very similar to those obtained by growth in the absence of an electric field.

SUMMARY

The objective of the invention was to overcome the problems of the prior art by developing a process for depositing diamond on a substrate, this process making it possible to obtain a coating having an adhesion to the substrate that is greater than that obtained by the prior art processes.

A first subject of the invention is a process for depositing diamond on a substrate, by CVD, or chemical vapor deposition, this process comprising at least:

a) an initiation step;
b) a nucleation step;
c) a growth step, the growth step comprising at least one sequence of two successive phases, the first phase being a coalescence phase without application of an electric field and the second phase being a secondary nucleation phase with application of an electric field, advantageously with application of a negative electric field.

The invention applies to various substrates chosen as a function of the application in question:

cobalt tungsten carbide (WC—Co);

titanium Ti, or a titanium alloy (TA6V or Ti-6Al-4V, Ti—Nb, etc.);

a ceramic such as: $Si_3N_4$, TiC, SiC and other carbides;

silicon wafers customarily used in the microelectronics industry.

Preferably, the substrate is chosen from: a cobalt tungsten carbide (WC—Co), titanium, or a titanium alloy.

Preferably, for machining composites, the substrate is a cobalt tungsten carbide (WC—Co) comprising from 4 to 14% by weight of cobalt.

Advantageously, the substrate is prepared, before its use in the diamond deposition process, by application of a treatment chosen from: mechanical pickling and chemical pickling.

Preferably, the substrate is firstly subjected to a mechanical pickling and then optionally to a chemical pickling.

When the substrate is WC—Co comprising from 4 to 6% of Co, after degreasing, provision is advantageously made for a mechanical pickling (a treatment by spraying with corundum microbeads for example) followed by a chemical pickling of the substrate before carrying out the process of the invention. According to this variant, the cobalt content in the vicinity of the surface is reduced by chemical etching: the tungsten carbide substrates are pickled in a basic bath then rinsed with water and immersed in a $H_2SO_4/H_2O_2$ bath so as to deplete the surface of cobalt. They are then rinsed and immersed in an alcohol-containing solution, under ultrasonic waves, containing diamond grains.

When the substrate is WC—Co comprising from 6 to 14% of Co, provision is advantageously made for a mechanical pickling of the substrate before the implementation of the process of the invention. In a known manner, provision may be made that, prior to the deposition, the supports are subjected to a treatment by spraying microbeads of a hard material under pressure, and are then cleaned. It is possible, for example, to spray the surface with corundum microbeads.

In a known manner, in order to ensure the nucleation, growth and adhesion of the diamond, and in order to prevent the presence, at the surface of the substrate, of species such as cobalt that induce the formation of graphite ($sp^2$) to the detriment of that of diamond ($sp^3$), provision may be made to deposit a diffusion barrier on the substrate, before step a) of the diamond deposition process.

In accordance with the teaching from the prior art (J. P. Manaud et al., Surface and Coatings Technology, volume 202, Issue 2, 25 Nov. 2007, p. 222-231) the material chosen for the diffusion barrier layer may be chosen from: niobium nitride (NbN), tantalum nitride (TaN), hafnium nitride (HfN) and zirconium nitride (ZrN). They may be deposited as layers of small thickness (for example from 0.5 to 1 micron) as a cobalt diffusion barrier during diamond deposition processes up to 900° C. During the deposition of the diamond, NbN and TaN are converted to carbides NbC and TaC whereas ZrN and HfN are preserved. They require the additive deposition of a metallic nucleation layer in which the dissolution of carbon is suitable for bulk nucleation (P-O Joffreau et al., MRS Spring Films, 5-9 Apr. 1988, Reno, Nev.). This is the case, for example, for molybdenum (Yuan-Sheng Huang et al., Thin Solid Films, volume 472, Issues 1-2, 24 Jan. 2005, p. 20-25) which therefore promotes the rapid nucleation of the diamond. The same methods make it possible to obtain barriers of hafnium nitride HfN that are just as effective as ZrN.

The tantalum nitride, niobium nitride, zirconium nitride or hafnium nitride barriers are deposited at temperatures between 400 and 500° C. by reactive cathode sputtering of a metallic target for flat substrates. Nitrogen is added as a reactive gas. For substrates of more complex shape, such as drills and cutters, there are industrial cathode sputtering machines equipped with special devices that enable uniform deposition.

The zirconium and niobium nitrides may also be obtained by RPAE (reactive plasma-assisted evaporation) for complex shapes such as drills or cutters. For this technique, the metal is evaporated, using an electron gun, from a metal source. Nitrogen is added as reactive gas either in the form of dinitrogen, or better still in the form of radical monoatomic or neutral nitrogen via a post-discharge surfatron source of a microwave plasma. As in all low-pressure reactive processes, the evaporation rates and the partial pressures of the gases are dependent parameters that must be rigorously controlled and optimized for each process and for each deposition machine.

These controls are part of the adjustments that a person skilled in the art may make from the procedures described below in the experimental section.

Advantageously, the process of the invention comprises a step of depositing a nucleation and tie layer after the deposition of a diffusion barrier. The nucleation and tie layer consists, in a known manner, of a metal intended to be carburized. This step comprises the deposition of a metal, which may be chosen from: Mo, W, Cr, Fe, Ti, Zr, Hf, Nb, Ta, etc. on condition that the nitride of this metal is not thermochemically more stable than that of the metal constituting the barrier. Otherwise it could, by simple raising of the temperature, react with the diffusion barrier and destroy it.

On the diffusion barrier, the metal intended to be carburized during the initial diamondizing phase is deposited by the same methods as the deposition of the diffusion barrier layer. The rate of diffusion of the carbon into this metal and its carbide is a determining factor for the nucleation and coalescence phases of the diamond (MRS Spring Films, 5-9 Apr. 1988, Reno, Nev., P-O Joffreau et al.). The diamond seeds form from the moment when the dissolution of the carbon is slow enough. Therefore, it is imperative that the tie layer is rapidly saturated with carbon and that the diffusion barrier does not carburize (case of ZrN) or else carburizes sufficiently slowly (case of TaN and NbN) both for preventing the diffusion of the cobalt and for ensuring the rapid nucleation of the diamond.

The metal layer is deposited by the same process as that used for producing the diffusion barrier, that is to say either by cathode sputtering, or by plasma-assisted evaporation (non-reactive in this case). The thickness of the nucleation and tie layer is advantageously between 100 and 400 nm, preferably between 200 and 300 nm.

The chosen substrate, prepared, or not prepared, in accordance with the steps which have been described above, is then subjected to a diamond deposition process via CVD, this process comprising at least:

a) an initiation step;
b) a nucleation step;
c) a growth step, which will be described in detail below.

The CVD treatment may be carried out in any type of reactor and in particular: a microwave plasma CVD (MW-PCVD) reactor or a hot filament CVD (HFCVD) reactor. In both cases, the process requires a negative electric polarization of the substrate to be coated. Within the context of industrial development, it is preferred to carry out the process in a hot filament reactor, the operating reliability and stability of which are more readily ensured under an electric field.

Initiation:

When an MWCVD or HFCVD reactor is used, the initiation step consists in bringing the substrate to a temperature between 700 and 900° C., preferably between 800 and 900°

C., under a microwave frequency plasma of pure hydrogen or of a mixture of hydrogen and of a noble gas for a duration of between 10 and 30 minutes under an electric field with a direct current potential of −100 V to −350 V.

In the case of MWCVD, the microwave frequency plasma is a plasma of pure hydrogen or of a mixture of hydrogen and of a noble gas (He, Ne, Ar), applied for a duration of between 10 and 30 minutes, preferably of between 15 and 30 minutes, under an electric field with a direct current potential of −100 V to −350 V, in particular in the case of MWCVD, −100 V to −250 V. Advantageously, the power density is between 0.5 and 3 W/cm². Preferably, the potential is around −200 V, in the case of MWCVD, and the power density is around 1 W/cm².

The microwave frequency plasma has a dual role: the creation of radical neutral species and the heating of the substrate by radiation. Under such conditions, the surface is cleaned, deoxidized and chemically activated by creation of pendant bonds.

In the process using HFCVD, the very high temperature of the filaments makes it possible to break the bonds of the reactive molecules in order to obtain radical species. A small percentage of noble gas (He, Ne, Ar) may be added to help to initiate and maintain a plasma due to the negative polarization of the substrates. The value of this percentage depends on the noble gas used and on the geometry of the reactor equipment. Likewise, the voltage and the power of the electric field that are applied may depend on the geometry and on the size of the reactor. In the laboratory reactor which was used for carrying out the invention, the voltage is between −150 and −300 V for a power density of between 10 and 25 W/cm². The duration of the initiation step is identical to that of the MWCVD process.

Nucleation:

Bulk nucleation is obtained by supersaturation in carbon of the surface of the substrate at the same temperature and comprises the application of an electric field with a direct current potential of −100 V to −350 V, and in particular in the case of MWCVD of −100 V to −250 V, for a duration of between 20 and 60 minutes, advantageously between 30 and 60 minutes. Advantageously, the power density is between 0.5 and 2 W/cm². Preferably, the potential is around −200 V, in the case of MWCVD, and the power density is around 1 W/cm².

In order to do this, the hydrogen plasma of the initiation step is replaced by a plasma of a $H_2/CH_4/X$ mixture, in which X represents a noble or inert gas, with a volume percentage of noble or inert gas relative to the total volume of the mixture of between 0 and 20% depending on the gas and with a volume percentage of $CH_4$ relative to the total volume of the mixture of between 3 and 4%, preferably around 3%. The noble or inert gas X may be chosen, for example, from: helium, neon, argon, nitrogen or a mixture of these gases.

In this step, the role of the negative electric field is to create a plasma, the positive ions of which bombard the surface. This has the effect of multiplying the secondary nucleation sites, of sputtering the weakly adherent species particularly on the surface asperities and of redepositing them collaterally. This bombardment effect may be increased by the addition of a small proportion of noble gas. The advantage is that the reactions at the surface are extremely activated by the presence of neutral radical species (methyl and hydrogen radicals for example).

The combined effect of the supersaturation and of the electric field (H. Sein et al., Diamond & Related Materials 13 (2004), 610-615; H. Li et al., Diamond & Related Materials 16 (2007), 1918-1923), results in a very high nucleation density and an increase in the adhesion of the less adherent nuclei since, on the one hand, the less adherent seeds have been preferentially sputtered and, on the other hand, atoms of the substrate may be sputtered under the effect of the bombardment by positive ions resulting from the plasma. As the pressure is relatively high, the mean free path is very short and these atoms can be redeposited on the substrate, thus creating a pseudo-diffusion interface between the substrate and the diamond. This is an advantage when a diffusion barrier is used, especially if, as the metal, elements are chosen that have a relatively high sputtering efficiency such as chromium, germanium, molybdenum, zirconium, hafnium, niobium, tantalum or tungsten. These processes are well known to experts in surface treatments via cold plasmas and via ionic depositions.

Growth:

The growth step, preferably at a temperature of between 800 and 900° C., breaks down into two sequences and in fine makes it possible to obtain pyramids essentially, and originally, consisting of diamond nanograins. It comprises alternate phases, with a duration of between 20 and 40 minutes, preferably around 30 minutes each, of coalescence with no electric field applied then of etching under an electric field, advantageously a negative electric field.

Advantageously, the alternate phases of coalescence without an electric field then of etching under a negative electric field are carried out under the following conditions:
duration of each phase between 20 and 40 minutes;
application of a plasma of a gas chosen from:
    a $H_2/CH_4/X$ mixture in which X represents a noble or inert gas, with a volume percentage of noble or inert gas relative to the total volume of the mixture of between 0 and 10% and with a volume percentage of $CH_4$ relative to the total volume of the mixture of between 0.5 and 1.5%;
    a $H_2/CH_4/CO_2$ mixture, volume of the $CH_4/CO_2$ mixture relative to the total volume of the gases of between 0.5 and 5% for a ratio of the volumes of $CH_4/CO_2$ of between 0.2 and 0.8;
    a $CH_4/CO_2$ mixture with a ratio of the volumes of $CH_4/CO_2$ of between 0.4 and 0.6;
the total flow rate of the gases being greater than 10 cm³/min, and the pressure being between 1 and 60 hPa.

Advantageously, according to a first variant, a plasma of a $H_2/CH_4/X$ mixture is applied in which X represents a noble or inert gas, with a volume percentage of noble or inert gas relative to the total volume of the mixture of between 0 and 10% and with a volume percentage of $CH_4$ relative to the total volume of the mixture of between 0.5 and 1.5%, preferably between 0.8 and 1.2%. The noble or inert gas X may be chosen, for example, from: argon, neon, helium, nitrogen or a mixture of these gases. In our laboratory reactor, the total flow rate is advantageously between 200 and 500 cm³/min. In another reactor, in particular on an industrial scale, a person skilled in the art should adapt these parameters as a function of the indications given below and in the experimental section.

According to a second variant, a mixture chosen from $H_2/CH_4/CO_2$ or $CH_4/CO_2$ is used, preferably at pressures of between 5 and 40 hPa and for flow rates, in our laboratory reactor, of between 10 and 150 cm³/min. In another reactor, in particular on an industrial scale, a person skilled in the art should adapt these parameters as a function of the indications given below and in the experimental section.

In all cases, the inlet flow rate of the precursor gases into the reactor strictly depends on the discharge rate of the reaction products and therefore on the power of the pump unit. Therefore, good equilibrium consists in maintaining the reactor, preferably, under laminar flow regime at pressures of between 5 and 40 hPa capable of ensuring:

a correct equilibrium of the plasma depending on the CVD process used;

a growth rate of the diamond that is acceptable for an industrial process; and the anticipated pyramidal nanocrystalline morphology (Pyr NCD).

The first coalescence phase, without application of an electric field, therefore begins just after the nucleation phase. During this phase, the size of the seeds increases and the grains formed can coalesce freely.

At the end of this phase, the same conditions are applied as in the coalescence step as regards the gaseous atmosphere conditions (mixture of gases, flow rate) and in addition an electric field with a negative direct current potential is applied. Advantageously, an electric field with a direct current potential of between −100 V and −350 V is applied, and in particular in the case of MWCVD, of −100 V to −250 V. Advantageously, the power density is between 1.5 and 15 W/cm$^2$ throughout the duration of this phase, the potential preferably being −140 V to −200 V in the case of MWCVD, and advantageously around −200 V in the case of MWCVD, for a power density of between 2 and 12 W/cm$^2$ depending on the geometry of the reactor and on the size of the samples to be treated.

The plasma thus created "etches" the previously coalesced seeds via sputtering. Atoms of carbon are detached and others are provided by the gas mixture thus inducing a new local supersaturation in carbon in the vicinity of the surface. The conditions for a secondary nucleation are therefore again combined throughout the duration of this phase, after which the electric field will again be cut.

The process of the invention comprises at least one sequence of two successive phases, one being a coalescence phase without application of an electric field and the second being an etching and nucleation phase with application of an electric field, advantageously with application of a negative electric field.

After the etching phase, a new coalescence phase is then applied. The process may continue until a continuous layer is obtained. This process results in two effects, the combination of which gives the final deposition a new morphology: on the one hand the etching due to the electric field limits the unidirectional growth of the diamond orthogonally at the surface, and on the other hand the secondary nucleation induces the nanoscale size of the diamond grains. Finally, pyramidal morphology of a cluster of diamond nanograins is observed, which is linked to sequential erosion. At the same time, there is coalescence of the seeds in the vicinity of the previously formed pyramids which has the effect of enlarging their base and of increasing the area of contact with the substrate or the barrier. The etching effect may be accentuated by the optional addition of a small concentration of argon for harsh etching or of another gas (neon or nitrogen, etc.) for a milder etching. This favors 1—the secondary nucleation of the diamond in order to form nanograins but does not modify the pyramidal morphology and 2—the adhesion of the pyramids of diamond nanograins by increasing their base area and by creating a pseudo-diffused interface due to ionic bombardment and to redeposition of species.

Advantageously, this sequence is repeated as many times as necessary to obtain the desired thickness of the layer. The thickness obtained at each sequence depends on the reactor used and a person skilled in the art knows, from tests relating to a few sequences, how to adjust the number of sequences applied as a function of the desired thickness.

In the experimental microwave reactor designed and produced in our laboratory, an application of 1 to 5 sequences of these two phases gives a discontinuous diamond layer, whereas from 6 sequences onwards a continuous layer is obtained that has a thickness of the order of 1 to 4 microns.

A reasonable thickness for a cutting tool lies between 2 and 4 microns. Beyond that, the residual stresses are such that they promote delamination.

Advantageously, provision is therefore made to deposit a layer of diamond having a thickness between 2 and 4 μm.

In the case of a deposition in a hot filament CVD reactor, certain deposition conditions described above must be respected. The filaments (tungsten or tantalum) brought to high temperature (1800 to 3000° C.) then replace the microwave plasma in order to create the radical species. The substrates must be polarized and heated at a temperature between 700 and 900° C., under a plasma of pure hydrogen or of a mixture such as those described above for a duration of between 10 and 30 minutes under an electric field with a direct voltage of between −120 V and −350 V. The gaseous precursors are the same, on the other hand the pressures and the flow rates are modified in accordance with the geometry of the constituents of the reactor.

The diamond layers obtained have a much lower stress level than that of the diamond layers known from the prior art, which limits the problems of delamination. The time necessary for the deposition in order to obtain a continuous layer or a layer of a given thickness is a parameter that depends on the geometry of the reactor. Therefore, it must be adapted to the existing industrial tool.

Advantageously, the process of the invention also comprises an additional tribological coating step.

The tribological coating of the diamond is designed to fulfill two roles which must be optimized depending on the application envisaged for the tool. The first role of the coating is, by filling intergranular spaces, to strengthen the cohesion of the layer by laterally blocking the crystallites relative to one another. This increases the resistance to tangential forces on the layer and may increase the impact strength. The second role of the coating is to ensure the best possible slip of the surface of the tool over the machined material. The properties required for this coating are to have a mean Young's modulus so as to ensure sufficient stiffness, while being tough enough and plastic enough not to be brittle. It must be relatively chemically inert at the machining temperatures, especially with respect to oxygen. It must also have a sliding coefficient that is as low as possible with respect to the potentially machined material. In conclusion, this coating material is chosen depending on the purpose of the tool and of the temperature at which it must operate. For machining operations at moderate temperature (aluminum alloy, non-ferrous metals, etc.), the DLC (mixture of sp$^2$ graphitic carbon and of sp$^3$ diamond-type carbon), the nitrides or carbonitrides of chromium, titanium, zirconium or hafnium, and titanium diboride are perfectly suitable. For abrasive machining operations or machining operations at higher temperatures, alumina $Al_2O_3$ exhibits a real advantage due to its oxidation resistance, which furthermore protects the diamond which is very sensitive to oxidation.

This novel process provides a significant improvement in the manufacture of diamond nanograin depositions. It is simple to implement and makes it possible to use equipment already employed for this application with a simple adaptation that can be carried out easily. Preferably, the conventional microwave CVD or hot filament CVD deposition machine is equipped with a device for polarizing the substrates by computerized application of the electric field.

The discontinuous application of the electric field during the growth phase of the layer artificially creates periods of renucleation without however increasing the concentration of carbon-based precursor in the gas phase, which limits the presence of graphitic species and therefore promotes the adhesion of the diamond.

The morphology of the coating may be adjusted effortlessly going from a simple juxtaposition of blocks of pyramids to a continuous layer.

This process may be used with carbide surface preparation techniques that are widely used to date or with more sophisticated techniques as set out in the descriptive section. It also enables a subsequent decorative or tribological treatment.

The coatings obtained by the process of the invention are novel and constitute another subject matter of the invention.

In particular, one subject of the invention is an article comprising a substrate as described above on which there is a layer of diamond nanograins of pyramidal shape.

The morphological structure of the layer of diamond nanograins assembled as pyramidal aggregates can be characterized by scanning electron microscopy, by transmission electron microscopy, by X-ray diffraction and by Raman spectroscopy.

The diamond layer obtained is in the form of pyramids of micron size having flat bases essentially constituted of diamond nanograins, that is to say of diamond grains, the size of which, defined by the diameter of the grains, may range from 1 to 100 nm, which constitutes a new morphology of the diamond deposited on a rough surface of a multi-material composite as shown by the scanning microscopy photographs (FIGS. 1a, 1b and 4a, 4b, 4c). Furthermore, this layer may be discontinuous or continuous depending on the duration of the process which opens the way to an additional surface treatment having a tribological role (hyper-slip) or decorative role (color code for example).

Unlike the prior art processes, the process of the invention gives access to layers of pyramidal aggregates of diamond grains of nanoscale size, namely diamond grains, the size of which is between a few nanometers and a few tens of nanometers and these diamond nanograins may be deposited so as to form a continuous layer, having a thickness of less than one micron, whereas the prior art processes did not make it possible to obtain a continuous layer of diamond having a thickness of less than one micron.

Due to their pseudo-diffused interfaces, and to the enlarged and continuous base of the pyramidal aggregates, the materials of the invention have increased adhesion and increased resistance to tangential forces. This promotes a better resistance to delamination of the diamond layer.

BRIEF DESCRIPTION OF THE FIGURES

Experimental Section

Figures

DETAILED DESCRIPTION

Figures 1A, 1B:
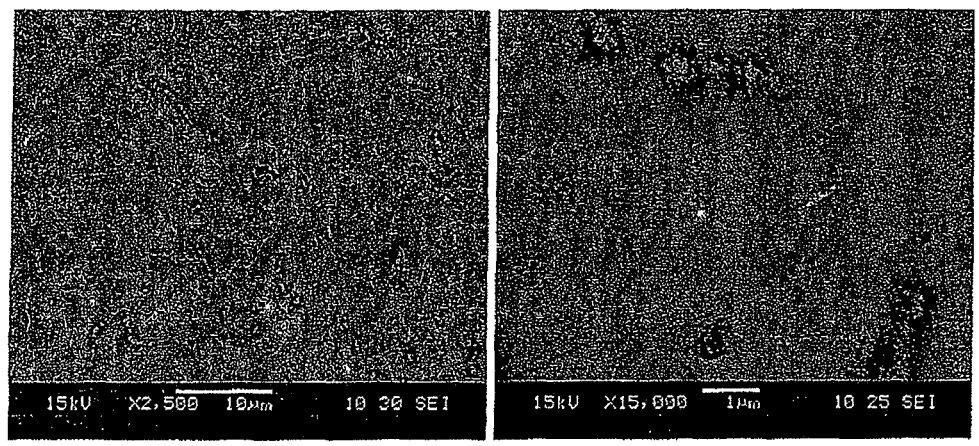
FIG. 1a and 1b: Scanning electron microscopy photographs (top view) of a substrate coated with a layer of diamond nanograins of pyramidal structure (PyrNCD).

The diamond was deposited in a microwave reactor made in our laboratory. It consists of a 50 mm diameter quartz tube placed orthogonally in the waveguide and evacuated by a vacuum pump. The substrate holder, composed of a 12 mm diameter disk of 304 stainless steel can be negatively polarized by a direct voltage generator, the value of which can be varied from 0 to −250 V via a filtered power supply. The current may be measured at any moment.

The precursors used are hydrogen and methane previously mixed by mass flow meters that mix and regulate the gas streams. Argon or another noble gas such as helium or neon may be added in a small proportion during the initiation and nucleation phases in order to increase the effects of sputtering of the substrate and to promote the creation of a pseudo-diffused interface.

Other precursors were used such as $H_2/CH_4/CO_2$ mixtures. The pressure during the deposition was optimized at 40 hPa for a total flow rate of 450 cm$^3$/min. The temperature measured by a dual-band optical pyrometer may be set between 700 and 900° C.

The reaction scheme comprises 3 steps: initiation, nucleation and growth.

The substrates which are used are small 15×15 mm$^2$ plates of WC—Co cermets containing from 6 to 10% of cobalt, of Teledyne brand, grades K 10; P 30 M and P 40 M. Disks having a thickness of 1 to 4 mm cut from K40 UF bars of carbide WC-10% Co having a diameter of 16 mm, used as raw material for their industrial manufacture of cutters and drills, were also used.

Production of a Cutting Tool Treated With PyrNCD Diamond

1—Deposition of PyrNCD on WC-6% Co Substrate After Chemical Pickling a—Substrate Preparation:

The supports are sprayed with microbeads for a few seconds under the following conditions:
air pressure: 200 kPa;
corundum microbeads; average size: 50 microns;
distance between the nozzle and the substrates: 10 cm.

The supports were then cleaned using ultrasonic waves in acetone and washed of any impurity using isopropyl alcohol vapor.

The cobalt content in the vicinity of the surface is then reduced by chemical etching: the tungsten carbide substrates are pickled in a basic bath then rinsed with water and immersed in a $H_2SO_4/H_2O_2$ bath for 15 seconds so as to deplete the surface of cobalt. They are then rinsed and immersed in an alcohol-containing solution, under ultrasonic waves, containing diamond grains of 1 micron.

b—Deposition of Diamond:

The PyrNCD is deposited as enlarged upon below in 2-d; 2-e and 2-f.

2—Deposition of PyrNCD on WC Substrate Rich In Co (≥6%)

For machining composites, tools are used, the support of which is made of tungsten carbide. The most common currently contain 6% to 12% of cobalt. The effectiveness of the barrier as proposed hereinbelow is independent of the cobalt content, the latter value is therefore not limiting. On the other hand, considering the relatively high temperature of the deposition of diamond (700-900° C.), it is preferred to avoid adding any element that may lead to the formation of mixed carbides via decarburization of the tungsten carbide, such as titanium or tantalum, due to the embrittlement of the support that this would induce.

a—Substrate Preparation:

Prior to the deposition, the supports are sprayed with microbeads for a few seconds under the following conditions:
air pressure: 200 kPa;
corundum microbeads; average size: 50 microns;
distance between the nozzle and the substrates: 10 cm.

The supports were then cleaned using ultrasonic waves in acetone and washed of any impurity using isopropyl alcohol vapor.

b—Deposition of a Diffusion Barrier

For this step, a Leybold L560 machine was used, the total pressure of the gases during the deposition of the diffusion barrier was maintained at 0.5 Pa. Depositions by reactive sputtering were carried out from metal targets of Nb, Ta, Zr or Hf with a power density between 2.5 and 3.5 W/cm$^2$ and a concentration of dinitrogen of between 6 and 10% in argon. This highly directional method, of easy implementation, is very suitable in the laboratory for flat substrates such as cutting, turning or planing plates. However, it should be noted that industrial reactive cathode sputtering machines may be designed to deposit uniform layers on complex substrates. Depositions by RPAE have been carried out via evaporation of metal charges of niobium or of zirconium by a multi-crucible electron gun under a total pressure of 0.5 Pa of pure argon for the initial pickling of the surface, then of an Ar/N$_2$ mixture, the content of which varied from 95 to 100% of dinitrogen depending on the evaporation rate of the charge. The substrate holder, placed at approximately fifteen centimeters above the crucible, was negatively polarized (RF voltage of between −500 and −1500 V). The substrates are heated either via Joule effect or by ionic bombardment so as to obtain a dense column growth. Temperatures between 400 and 500° C. proved particularly suitable since, on the one hand, they provide a very good cohesion of the substrate and of the barrier and, on the other hand, located mid-way between the ambient temperature and the temperature of the diamondizing process, the effects of the stresses of thermal origin are reduced and therefore no cracking or detachment were observed.

c—Deposition of a Nucleation and Tie Layer

Follow the same techniques as described in §2-b above, and with the same parameters (the addition of dinitrogen no longer being necessary, it was then stopped), 200 nm of molybdenum was deposited consecutively on WC—Co supports previously coated with a nitride barrier.

d—Initiation:

During this step, the substrate was brought to a temperature of 850° C. under a microwave frequency plasma of pure hydrogen at the pressure of 40 hPa for 15 minutes under an electric field of −200 V. The power density was 1 W/cm$^2$.

e—Nucleation:

A plasma of a H$_2$/CH$_4$ mixture was applied, in which the methane concentration was brought to 3% by volume relative to the total volume of gas, under a continuous polarization of −200 V over 30 minutes. The power density was also 1 W/cm$^2$. The temperature was 850° C. and the pressure was maintained at 40 hPa for a total flow rate of 250 cm$^3$/min.

f—Growth:

The growth step takes place at 850° C. and breaks down into two sequences: it comprises alternate phases of a duration of thirty minutes each of coalescence without an electric field applied then of etching with a negative electric field. The growth conditions comprise the use of a mixture consisting of 99.2% hydrogen, 0.8% methane under a total pressure of 40 hPa and a total flow rate of 450 cm$^3$/min.

The first coalescence phase, with no electric field applied, begins just after the nucleation step. Over 30 minutes, the size of the seeds increases and the grains formed can coalesce freely. At the end of this phase, a direct voltage of −200 V is applied over 30 minutes without changing anything about the gaseous atmosphere conditions. The power density measured was 1 W/cm$^2$. This density increases, for the same applied voltage, during subsequent etching phases.

The succession of sequences is applied for a duration of 6 h, the final power density measured was 8 W/cm$^2$.

g—Tribological Coating:

Tribological coating is one option intended to minimize the effects of mechanical and thermal stresses on the behavior of the diamond layer that is very sensitive to oxidation.

The material deposited must have a friction coefficient that is as low as possible and an oxidation resistance greater than that of diamond.

Deposited as a meso-microscale layer, by reactive cathode sputtering and by RPAE, under the same conditions as those used for the deposition of the diffusion barriers, where zirconium nitride ZrN (friction coefficient 0.3 to 0.5), chromium nitride CrN (friction coefficient on steel 0.4) and alumina Al$_2$O$_3$ (friction coefficient 0.4).

The zirconium and chromium nitrides are well known as materials for the surface treatment of cutting tools.

By annealing in air at various temperatures it has been demonstrated that ZrN is stable up to 500° C., from which temperature it begins to form ZrO$_2$. CrN is stable up to 700° C. and alumina is well known for being stable well beyond 1000° C. Anchoring alumina to the diamond layer is favored by the prior low-temperature deposition of a thin layer of titanium or of zirconium of 50 to 150 nm in thickness.

3—Analysis:

The substrate obtained at the end of steps 2a to 2f was studied.

Figure 2:
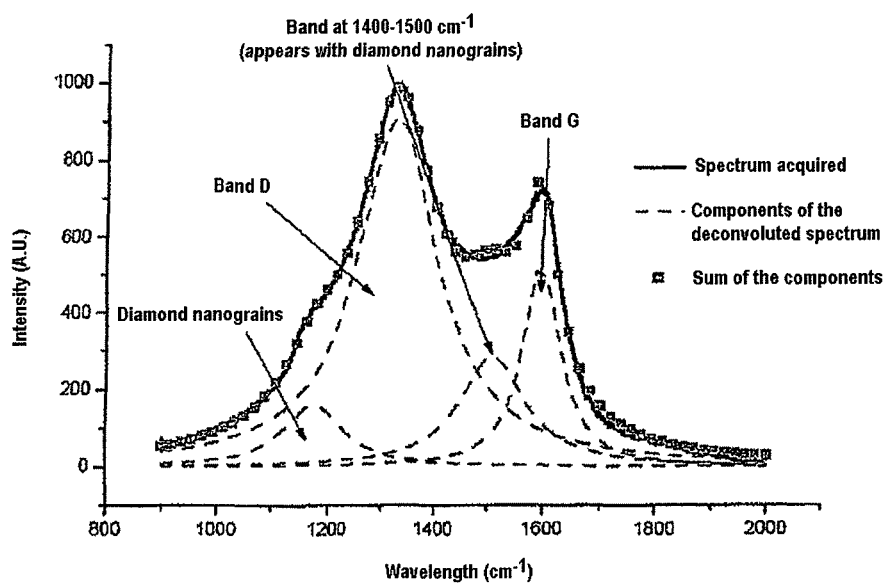
FIG. 2: Deconvoluted Raman spectroscopy spectrum of a substrate coated with a layer of diamond nanograins of pyramidal structure (PyrNCD).

In FIG. 1a the 2D morphological appearance of the diamond surface can be seen. The pyramidal appearance of the coating is clearly demonstrated. For this deposition, carried out at 800° C. for 3 hours, the layer is discontinuous, the dark zones reveal the surface of the interfacial layers (barrier+tie layers). A greater magnification (FIG. 1b) makes it possible to demonstrate the presence of aggregates of nanoscale grains characteristic of a layer of PyrNCD going by the surface appearance of "pyramids". Furthermore, this result is validated by Raman analysis (FIG. 2) which clearly shows the presence of peaks characteristic of nanoscale diamond grains.

Figure 3:
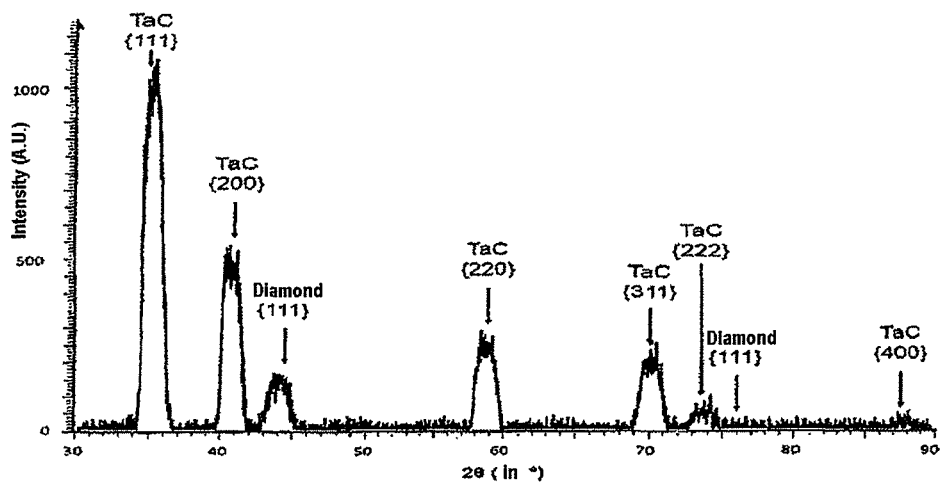
FIG. 3: X-ray diffraction spectrum at an incidence of 2.5° of a substrate coated with a layer of diamond nanograins of pyramidal structure (PyrNCD) and with a diffusion barrier of tantalum nitride converted to tantalum carbide during the deposition of diamond.

FIG. 3 shows the result of a low-incidence X-ray diffraction analysis of the surface of the diamond-like coating, a technique that makes it possible to analyze the coating with very little signal coming from the substrate. Besides the obvious presence of diamond at the surface, this analysis makes it possible to note the strong texturing of the layers and also to validate the almost complete carburization of the intermediate layer of TaN to TaC, which in no way impairs its cobalt barrier effect. The layer of Mo, too thin for this type of analysis, does not appear.

Figure 4A:
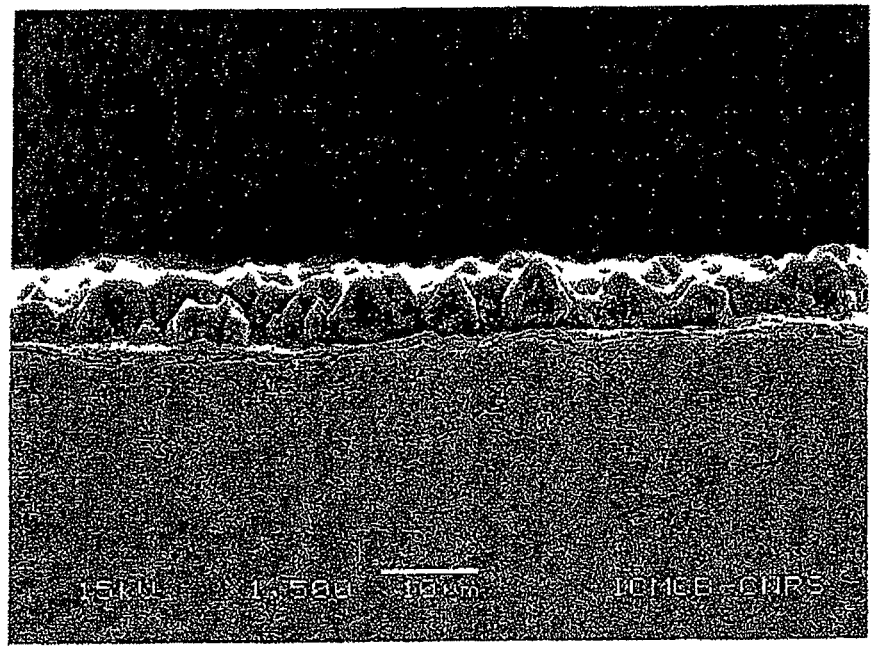
FIG. 4a, 4b, 4c: Scanning electron microscopy photographs (cross-sectional view) showing the tungsten carbide grains of the WC—Co cermet; the barrier interface, the tie layer and the diamond pyramids.
Figure 4B:
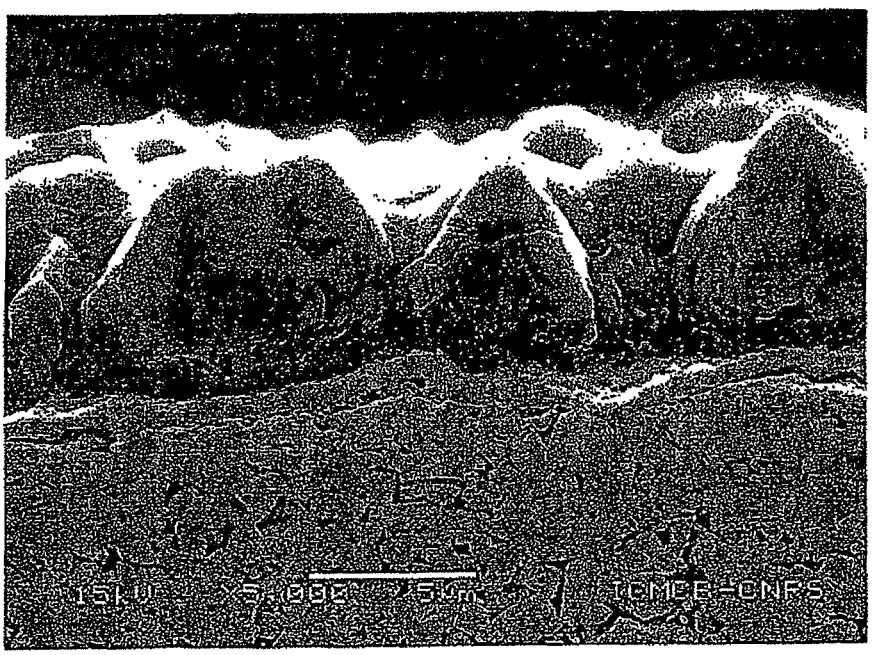
Figure 4C:
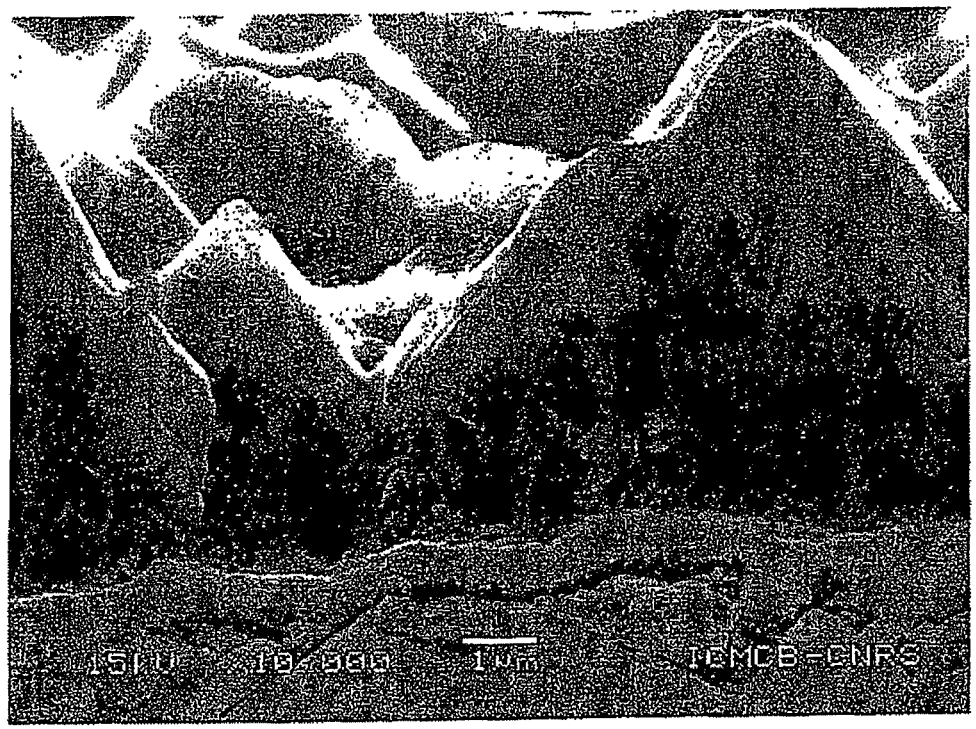

FIGS. 4a, 4b and 4c make it possible to observe the diamond multi-material composite in cross section at various magnifications. The diamond layer is continuous after a deposition of 6 h at 850° C. The presence of the continuous and microscale interfacial layer (TaN converted to TaC) between the substrate and the diamond coating is noted. The layer of molybdenum of very small thickness is not visible whereas it is on other analyses made on samples subjected to a deposition at 850° C. for 3 hours only. This type of observation also demonstrates the pyramidal shape of the coating. The very small size, less than 1/10 of a micron of the diamond grains is noted in the vicinity of the interfacial layer. This is due to the supersaturation in carbon during the nucleation phase. On the sides of the pyramids, the growth of diamond nanograins is observed whereas the pyramids themselves have a very dense crystalline appearance. The rounded edges of the pyramids are due to the erosive action of the electric field. The absence of decohesion between the various layers is demonstrated. This is one of the strong points of this novel process.

The invention claimed is:

1. A process for depositing diamond on a substrate, by chemical vapor deposition, this process comprising at least:
   a) an initiation step;
   b) a nucleation step;
   c) a growth step, the growth step comprising two or more sequences of two successive phases, the first phase being a coalescence phase without application of an electric field and the second phase being an etching and a nucleation phase with application of a negative electric field that creates a plasma, carried out under the following conditions:
   duration of each phase between 20 and 40 minutes;
   application of a gas chosen from:
      a $H_2/CH_4/X$ mixture in which X represents a noble or inert gas, with a volume percentage of noble or inert gas relative to the total volume of the mixture of between 0 and 10% and with a volume percentage of $CH_4$ relative to the total volume of the mixture of between 0.5 and 1.5%;
      a $H_2/CH_4/CO_2$ mixture, volume of the $CH_4/CO_2$ mixture relative to the total volume of the gases of between 0.5 and 5% for a ratio of the volumes of $CH_4/CO_2$ of between 0.2 and 0.8;
      a $CH_4/CO_2$ mixture with a ratio of the volumes of $CH_4/CO_2$ of between 0.4 and 0.6;
   the total flow rate of the gases being greater than 10 cm$^3$/min, and the pressure being between 1 and 60 hPa, and
   wherein gas flow rates and gas mixtures applied in the etching and nucleation phase are the same as gas flow rates and gas mixtures applied in the coalescence phase, and wherein the diamond layer obtained is in the form of micron size pyramidal aggregates having flat bases essentially constituted of diamond nanograins, that is to say of diamond grains, the size of which, defined by the diameter of the grains, ranges from 1 to 100 nm.

2. The process as claimed in claim 1, in which the substrate is chosen from: cobalt tungsten carbide (WC—Co), titanium, or a titanium alloy.

3. The process as claimed in claim 2, in which the substrate is a cobalt tungsten carbide (WC—Co) comprising from 4 to 14% by weight of cobalt.

4. The process as claimed in claim 3, in which the substrate is prepared by application of a treatment chosen from: mechanical pickling and chemical pickling.

5. The process as claimed in claim 1, which comprises a step of depositing a diffusion barrier on the substrate, before step a).

6. The process as claimed in claim 5, which comprises a step of depositing a nucleation and tie layer after the deposition of a diffusion barrier.

7. The process as claimed in claim 1, which is carried out in a hot filament reactor also commonly called HFCVD.

8. The process as claimed in claim 1, in which the initiation step consists in bringing the substrate to a temperature between 700 and 900° C., under a microwave frequency plasma of pure hydrogen or of a mixture of hydrogen and of a noble gas for a duration of between 10 and 30 minutes under an electric field with a direct current potential of −100 V to −350 V.

9. The process as claimed in claim 1, in which the nucleation step comprises the application of an electric field with a direct current potential between −100 V and −350 V for a duration between 20 and 60 minutes, in the presence of a plasma of a $H_2/CH_4/X$ mixture, in which X represents a noble or inert gas, with a volume percentage of noble or inert gas relative to the total volume of the mixture of between 0 and 20% and with a volume percentage of $CH_4$ relative to the total volume of the mixture of between 3 and 4%.

10. The process as claimed in claim 1, wherein the negative electric field has a direct current potential of −100 V to −250 V.

11. The process as claimed in claim 10, in which during the etching phase, an electric field with a direct current potential of −100 V to −350 V is applied.

12. The process as claimed in claim 1, which also comprises an additional tribological coating step.

* * * * *